(12) United States Patent
Morikazu

(10) Patent No.: US 7,919,725 B2
(45) Date of Patent: Apr. 5, 2011

(54) VIA HOLE FORMING METHOD

(75) Inventor: Hiroshi Morikazu, Tokyo (JP)

(73) Assignee: Disco Corporation, Tokyo (JP)

( * ) Notice: Subject to any disclaimer, the term of this patent is extended or adjusted under 35 U.S.C. 154(b) by 730 days.

(21) Appl. No.: 11/898,505

(22) Filed: Sep. 12, 2007

(65) Prior Publication Data

US 2008/0067157 A1    Mar. 20, 2008

(30) Foreign Application Priority Data

Sep. 14, 2006 (JP) .................................. 2006-249794

(51) Int. Cl.
*B23K 26/38* (2006.01)

(52) U.S. Cl. .................................. 219/121.71

(58) Field of Classification Search ............... 219/121.7, 219/121.71
See application file for complete search history.

(56) References Cited

U.S. PATENT DOCUMENTS

| | | | | |
|---|---|---|---|---|
| 6,822,324 B2 * | 11/2004 | Tao et al. | ...................... | 438/108 |
| 2004/0112881 A1 * | 6/2004 | Bloemeke et al. | ....... | 219/121.71 |
| 2007/0045254 A1 | 3/2007 | Morikazu | | |

FOREIGN PATENT DOCUMENTS

| | | | | |
|---|---|---|---|---|
| JP | 2-133189 A | * | 5/1990 |
| JP | 4-273195 A | * | 9/1992 |
| JP | 2000-197987 A | * | 7/2000 |
| JP | 2000-202664 A | * | 7/2000 |
| JP | 2002-217551 A | * | 8/2002 |
| JP | 2003-163323 | | 6/2003 |
| JP | 2005-28428 A | * | 2/2005 |
| JP | 2007-67082 | | 3/2007 |

OTHER PUBLICATIONS

Machine translation of Japan Patent document No. 2000-2002,664, Apr. 2010.*
Machine translation of Japan Patent document No. 2002-217,551, Apr. 2010.*

* cited by examiner

*Primary Examiner* — Geoffrey S Evans
(74) *Attorney, Agent, or Firm* — Smith, Gambrell & Russell, LLP

(57) ABSTRACT

A method of forming a via hole reaching a bonding pad in a wafer having a plurality of devices on the front surface of a substrate and bonding pads on each of the devices, by applying a laser beam from the rear surface side of the substrate, comprising the steps of forming an annular groove by applying a laser beam to an annular area surrounding a via hole forming area on the rear surface of the substrate; and forming a via hole reaching a bonding pad by applying a laser beam to the via hole forming area surrounded by the annular groove from the rear surface side of the substrate.

1 Claim, 7 Drawing Sheets

VIA HOLE FORMING METHOD

FIELD OF THE INVENTION

The present invention relates to a processing method of forming a via hole reaching a bonding pad in a wafer having a plurality of devices on the front surface of a substrate and bonding pads on each of the devices, by applying a pulse laser beam from the rear surface side of the substrate to the wafer.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a device such as IC or LSI is formed in each of the sectioned areas. Individual semiconductor chips are manufactured by cutting this semiconductor wafer along the streets to divide it into the areas each having a device formed thereon.

To reduce the size and increase the number of functions of an apparatus, a modular structure in which a plurality of semiconductor chips are laminated in a layer and bonding pads of the laminated semiconductor chips are connected has been implemented and disclosed by JP-A 2003-163323, for example. This modular structure is such that a plurality of devices are formed on the front surface of a substrate constituting a semiconductor wafer and bonding pads are formed on each of the devices, via holes reaching the bonding pads are formed from the rear surface side of the substrate at positions where the bonding pads have been formed, and a conductive material such as aluminum or copper to be connected to the bonding pads is embedded in the via holes.

The via holes in the above semiconductor wafer are generally formed by a drill. However, the diameters of the via holes formed in the semiconductor wafer are as small as 100 to 300 µm, and drilling the via holes is not always satisfactory in terms of productivity. In addition, as the thickness of each of the above bonding pads is about 1 to 5 µm, the drilling must be controlled extremely accurately in order to form the via holes only in the substrate such as a silicon substrate that forms the wafer, without damaging the bonding pads.

To solve the above problem, the applicant of the present application has proposed as JP-A 2007-67082 a method of efficiently forming a via hole reaching a bonding pad in a wafer having a plurality of devices on the front surface of a substrate and bonding pads on each of the devices, by applying a pulse laser beam from the rear surface side of the substrate.

When a via hole reaching a bonding pad is formed by applying a pulse laser beam from the rear surface side of the substrate, debris produced by the application of the pulse laser beam accumulate annularly around the opening of the via hole on the rear surface of the substrate. Since the debris accumulate in a width of about 10 µm and a height of about 20 to 30 µm, a problem occurs in that they interfere with the stacking of individual chips. Further, when an insulating film made of epoxy resin and having a thickness of about 10 µm is formed on the rear surface of the substrate, the debris break through the insulating film and are exposed to cause reduction in the quality of a device.

SUMMARY OF THE INVENTION

It is an object of the present invention to provide a processing method of forming a via hole, which is capable of forming a via hole by preventing accumulated debris that are produced when a via hole reaching a bonding pad is formed by applying a laser beam from the rear surface side of the substrate from interfering with the stacking of individual chips and from breaking through an insulating film and being exposed on the rear surface of the substrate.

To attain the above object, according to the present invention, there is provided a processing method of forming a via hole reaching a bonding pad in a wafer having a plurality of devices on the front surface of a substrate and bonding pads on each of the devices, by applying a laser beam from the rear surface side of the substrate, comprising:

an annular groove forming step for forming an annular groove by applying a laser beam to an annular area surrounding a via hole forming area on the rear surface of the substrate; and a via hole forming step for forming a via hole reaching a bonding pad by applying a laser beam to the via hole forming area surrounded by the annular groove from the rear surface side of the substrate.

Further, according to the present invention, there is also provided a processing method of forming a via hole reaching a bonding pad in a wafer having a plurality of devices on the front surface of a substrate and bonding pads on each of the devices, by applying a laser beam from the rear surface side of the substrate, comprising:

a via hole forming step for forming a via hole reaching a bonding pad by applying a laser beam to the via hole forming area on the rear surface of the substrate from the rear surface side of the substrate; and a debris removing step for removing debris by applying a laser beam to the debris which accumulate around the opening of the via hole formed by the via hole forming step.

In the processing method of forming a via hole according to the present invention, after the annular groove is formed by applying a laser beam to the annular area surrounding the via hole forming area on the rear surface of the substrate, the via hole reaching the bonding pad is formed by applying a laser beam to the via hole forming area surrounded by the annular groove from the rear surface side of the substrate. Therefore, debris which are produced in the via hole forming step accumulate in the annular groove. Consequently, as the debris do not greatly project from the rear surface of the substrate, they do not interfere with the stacking of individual chips. Further, when an insulating film made of epoxy resin is formed on the rear surface of the substrate, the debris do not break through the insulating film and are exposed.

In the processing method of forming a via hole according to the present invention, after the via hole reaching the bonding pad is formed by applying a laser beam to the via hole forming area on the rear surface of the substrate from the rear surface side of the substrate, debris which have accumulated around the opening of the via hole formed by the via hole forming step is removed by applying a laser beam thereto. Therefore, the debris do not interfere with the stacking of individually divided chips. Further, when an insulating film made of epoxy resin is formed on the rear surface of the substrate, the debris do not break through the insulating film and are exposed.

DETAILED DESCRIPTION OF THE PREFERRED EMBODIMENTS

The via hole forming method of the present invention will be described in more detail hereinbelow with reference to the accompanying drawings.

Figure 1:
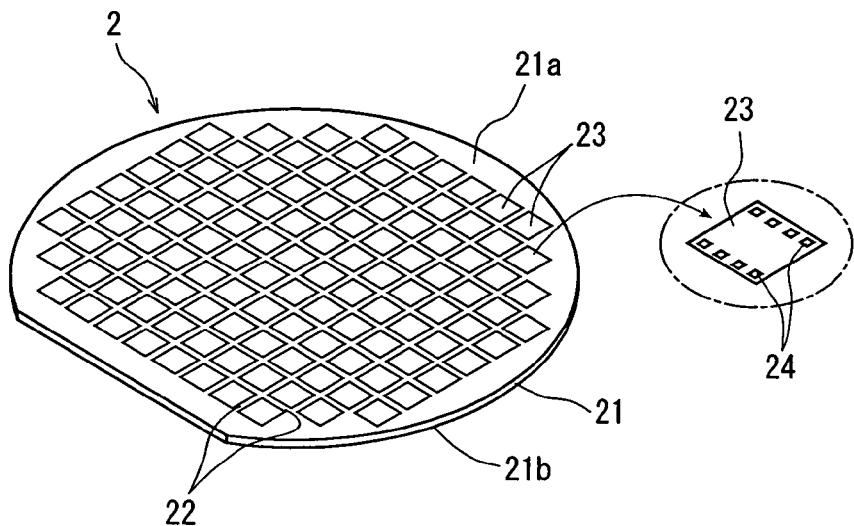
FIG. 1 is a perspective view of a semiconductor wafer as a wafer to be processed by the via hole forming method of the present invention.

FIG. 1 is a perspective view of a semiconductor wafer 2 as the wafer to be processed by the via hole forming method of the present invention. In the semiconductor wafer 2 shown in FIG. 1, a plurality of areas are sectioned by a plurality of streets 22 arranged in a lattice pattern on the front surface 21a of a substrate 21 made of silicon and having a thickness of, for example, 100 μm, and a device 23 such as IC or LSI is formed in each of the sectioned areas. The devices 23 are all the same in structure. A plurality of bonding pads 24 are formed on the surface of each device 23. The bonding pads 24 are made of a metal material such as aluminum, copper, gold, platinum or nickel and have a thickness of 1 to 5 μm.

Figure 2:
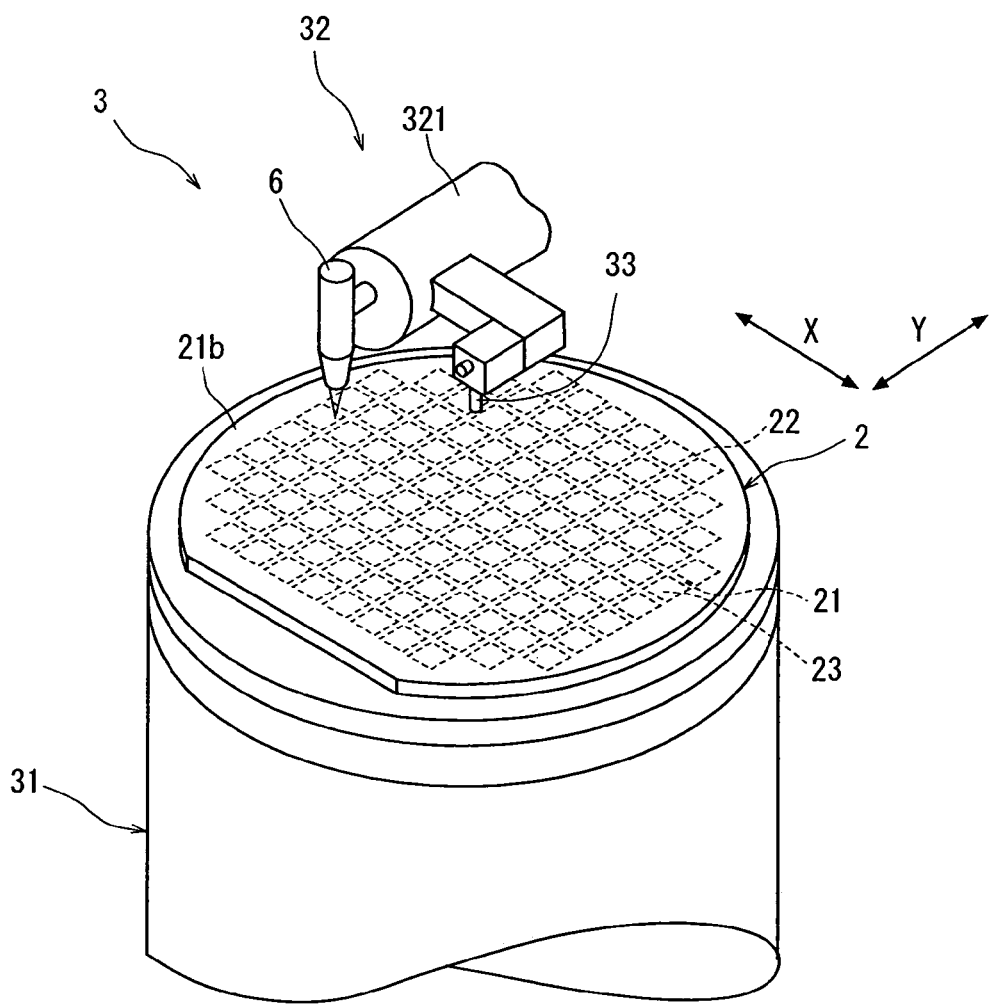
FIG. 2 is a perspective view of the principal portion of a laser beam processing machine for carrying out the via hole forming method of the present invention.

Via holes reaching the bonding pads 24 are formed in the above semiconductor wafer 2 by applying a pulse laser beam from the rear surface 21b side of the substrate 21. To form the via holes in the substrate 21 of the semiconductor wafer 2, a laser beam processing machine 3 shown in FIG. 2 is used. The laser beam processing machine 3 shown in FIG. 2 comprises a chuck table 31 for holding a workpiece and a laser beam application means 32 for applying a laser beam to the workpiece held on the chuck table 31. The chuck table 31 is constituteded to suction-hold the workpiece and is designed to be moved in a processing-feed direction indicated by an arrow X in FIG. 2 by a processing-feed mechanism (not shown) and an indexing-feed direction indicated by an arrow Y by an indexing-feed mechanism that is not shown.

The above laser beam application means 32 is installed in a cylindrical casing 321 arranged substantially horizontally. This laser beam application means 32 will be described with reference to FIG. 3.

Figure 3:
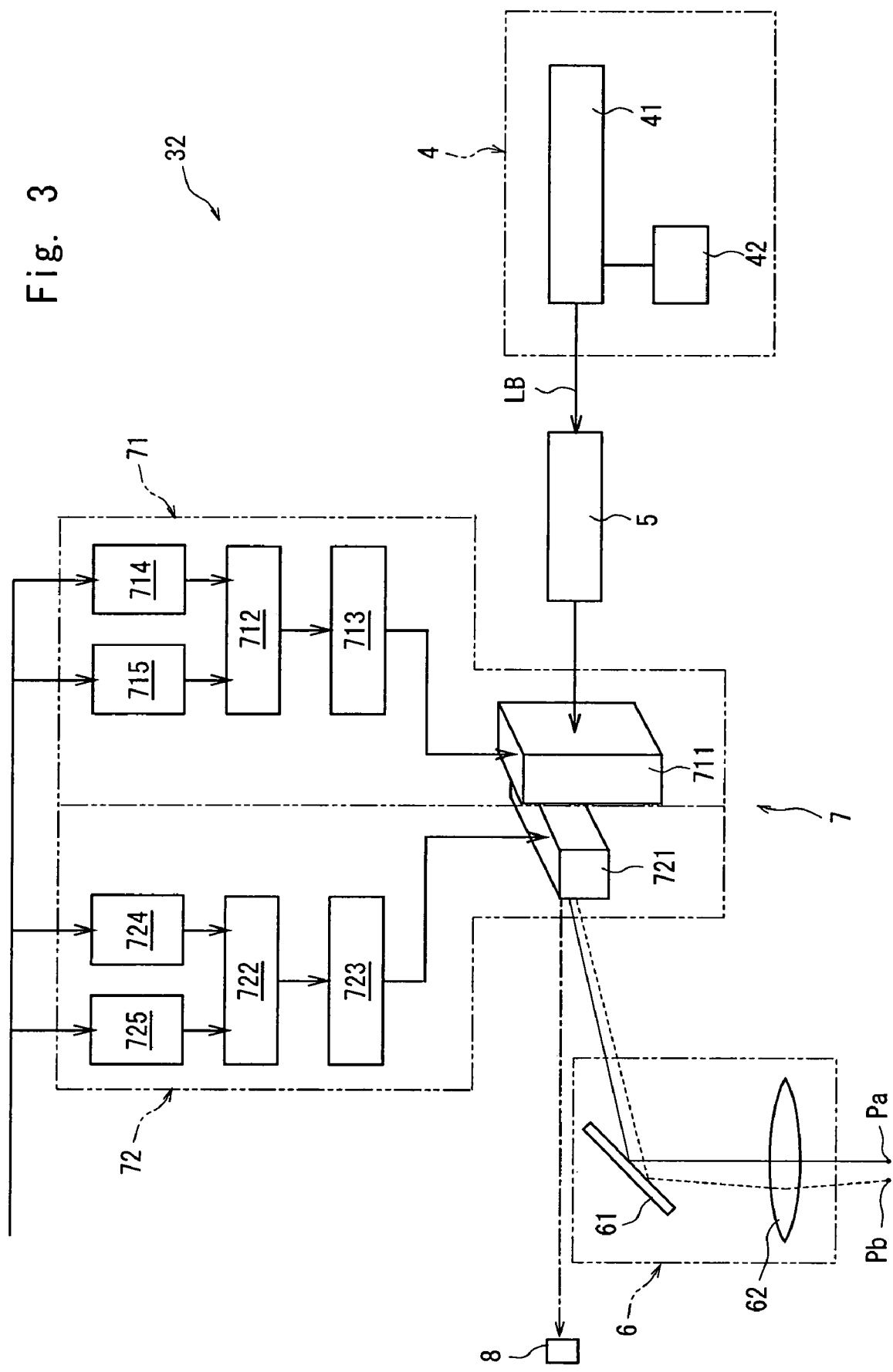
FIG. 3 is a block diagram of a laser beam application means provided in the laser beam processing machine shown in FIG. 2.

The laser beam application means 32 shown in FIG. 3 has a pulse laser beam oscillation means 4, an output adjustment means 5, a condenser 6 for converging a pulse laser beam which has been oscillated from the pulse laser beam oscillation means 4 and whose output has been adjusted by the output adjustment means 5, and a laser beam scanning means 7 interposed between the output adjustment means 5 and the condenser 6.

The above pulse laser beam oscillation means 4 comprises a pulse laser beam oscillator 41 and a repetition frequency setting means 42 connected to the pulse laser beam oscillator 41. The pulse laser beam oscillator 41 is composed of a YVO4 laser or YAG laser oscillator in the illustrated embodiment and oscillates a pulse laser beam LB of a wavelength (for example, 355 nm) having absorptivity for a workpiece made of silicon. The above output adjustment means 5 adjusts the output of the pulse laser beam LB oscillated from the pulse laser beam oscillation means 4 to a predetermined value.

The above condenser 6 comprises a direction changing mirror 61 for changing the direction of the pulse laser beam LB to a downward direction and a condenser lens 62 for converging the laser beam LB whose direction has been changed by the direction changing mirror 61, and is attached to the end of the casing 321 as shown in FIG. 2.

The above laser beam scanning means 7 comprises a first acousto-optic deflection means 71 for deflecting the optical axis of a laser beam oscillated from the pulse laser beam oscillation means 4 in the processing-feed direction (X direction) and a second acousto-optic deflection means 72 for deflecting the optical axis of a laser beam oscillated from the pulse laser beam oscillation means 4 in the indexing-feed direction (Y direction).

The above first acousto-optic deflection means 71 has a first acousto-optic device 711 for deflecting the optical axis of a laser beam oscillated from the laser beam oscillation means 4 in the processing-feed direction (X direction), a first RF oscillator 712 for generating RF (radio frequency) to be applied to the first acousto-optic device 711, a first RF amplifier 713 for amplifying the power of RF generated by the first RF oscillator 712 to apply it to the first acousto-optic device 711, a first deflection angle adjustment means 714 for adjusting the frequency of RF generated by the first RF oscillator 712, and a first output adjustment means 715 for adjusting the amplitude of RF generated by the first RF oscillator 712. The above first acousto-optic device 711 can adjust the deflection angle of the optical axis of a laser beam according to the frequency of the applied RF and the output of a laser beam according to the amplitude of the applied RF. The above first deflection angle adjustment means 714 and the above first output adjustment means 715 are controlled by a control means that is not shown.

The above second acousto-optic deflection means 72 has a second acousto-optic device 721 for deflecting the optical axis of a laser beam oscillated from the laser beam oscillation means 4 in the indexing-feed direction perpendicular to the processing-feed direction (X direction), a second RF oscillator 722 for generating RF to be applied to the second acousto-optic device 721, a second RF amplifier 723 for amplifying the power of RF generated by the second RF oscillator 722 to apply it to the second acousto-optic device 721, a second deflection angle adjustment means 724 for adjusting the frequency of RF generated by the second RF oscillator 722, and a second output adjustment means 725 for adjusting the amplitude of RF generated by the second RF oscillator 722. The above second acousto-optic device 721 can adjust the deflection angle of the optical axis of a laser beam according to the frequency of the applied RF and the output of a laser beam according to the amplitude of the applied RF. The above second deflection angle adjustment means 724 and the above second output adjustment means 725 are controlled by the control means that is not shown.

The laser beam application means 32 in the illustrated embodiment comprises a laser beam absorbing means 8 for absorbing a laser beam not deflected by the first acousto-optic device 711 as shown by the long dashed dotted line in FIG. 3 when RF is not applied to the above first acousto-optic device 711.

The laser beam application means 32 in the illustrated embodiment is constituted as described above. When RF is not applied to the first acousto-optic device 711 and the second acousto-optic device 721, a pulse laser beam oscillated from the pulse laser beam oscillation means 4 is guided to the laser beam absorbing means 8 through the output adjustment means 5, the first acousto-optic device 711 and the second acousto-optic device 721, as shown by the long dashed dotted line in FIG. 3. Meanwhile, when RF having a frequency of, for example, 10 kHz is applied to the first acousto-optic device 711, the optical axis of a pulse laser beam oscillated from the pulse laser beam oscillation means 4 is deflected and focused at a focal point Pa, as shown by the solid line in FIG. 3. When RF having a frequency of, for example, 20 kHz is applied to the first acousto-optic device 711, the optical axis of a pulse laser beam oscillated from the pulse laser beam oscillation means 4 is deflected and focused at a focal point Pb which shifts from the above focal point Pa by a predetermined distance in the processing-feed direction (X direction), as shown by the dashed line in FIG. 3. When RF having a predetermined frequency is applied to the second acousto-optic device 721, the optical axis of a pulse laser beam oscillated from the pulse laser beam oscillation means 4 is focused at a focal point which shifts from the above focal point Pa by a predetermined distance in the indexing-feed direction (Y direction: perpendicular to the sheet in FIG. 3) perpendicular to the processing-feed direction (X direction).

Figure 4:
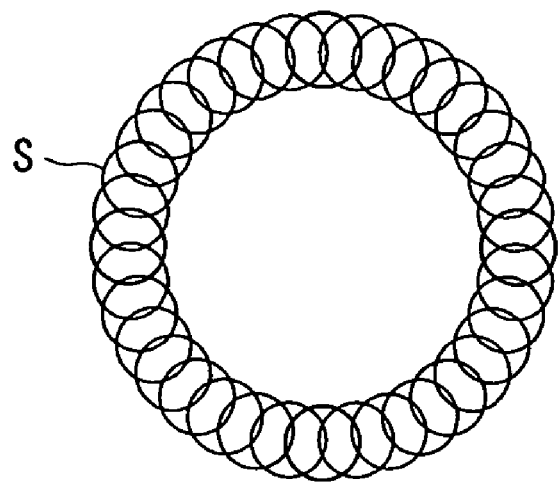
FIG. 4 is an explanatory diagram showing trepanning which is carried out by the laser beam application means shown in FIG. 3.

Therefore, trepanning processing for moving the spot S of the pulse laser beam annularly as shown in FIG. 4 can be carried out by activating the first acousto-optic deflection means 71 and the second acousto-optic deflection means 72 to deflect the optical axis of the pulse laser beam in the X direction and Y direction sequentially.

Returning to FIG. 2, the illustrated laser beam processing machine 3 has an image pick-up means 33 mounted on the end portion of the casing 321 constituting the above laser beam application means 32. This image pick-up means 33 is constituted by an infrared illuminating means for applying infrared radiation to the workpiece, an optical system for capturing infrared radiation irradiated by the infrared illuminating means, and an image pick-up device (infrared CCD) for outputting an electric signal corresponding to infrared radiation captured by the optical system, in addition to an ordinary image pick-up device (CCD) for picking up an image with visible radiation, in the illustrated embodiment. An image signal obtained is supplied to the control means that is described later.

A description will be subsequently given of a first embodiment of the method of forming via holes in the above semiconductor wafer 2 by using the above-described laser beam processing machine 3.

The front surface 2a of the semiconductor wafer 2 is first placed on the chuck table 31 of the laser beam processing machine 3 shown in FIG. 2, and the semiconductor wafer 2 is suction-held on the chuck table 31 (wafer holding step). Therefore, the semiconductor wafer 2 is held in such a manner that the rear surface 21b faces up.

The chuck table 31 suction-holding the semiconductor wafer 2 by carrying out the above wafer holding step is brought to a position right below the image pick-up means 33 by the processing-feed mechanism that is not shown. After the chuck table 31 is positioned right below the image pick-up means 33, the semiconductor wafer 2 on the chuck table 31 is supposed to be located at a predetermined coordinate position. In this state, alignment work for checking whether the streets 22 formed in a lattice pattern on the semiconductor wafer 2 held on the chuck table 31 are parallel to the X direction and the Y direction is carried out (aligning step). That is, the image pick-up means 33 picks up an image of the semiconductor wafer 2 held on the chuck table 31 and carries out image processing such as pattern matching, etc. to perform the alignment work. Although the street 22 formed front surface 21a of the substrate 21 of the semiconductor wafer 2 faces down at this point, an image of the streets 22 can be picked up through the rear surface 21b of the substrate 21 as the image pick-up means 33 is constituted by the infrared illuminating means, an optical system for capturing infrared radiation and an image pick-up device (infrared CCD) for outputting an electric signal corresponding to the infrared radiation, as described above.

By carrying out the above-described aligning step, the semiconductor wafer 2 held on the chuck table 31 is located at the predetermined coordinate position. Data on the designed coordinate positions of the plurality of bonding pads 24 formed on the devices 23 on the front surface 21a of the substrate 21 of the semiconductor wafer 2 are stored in the control means (not shown) of the laser beam processing machine 3 in advance.

Figure 5:
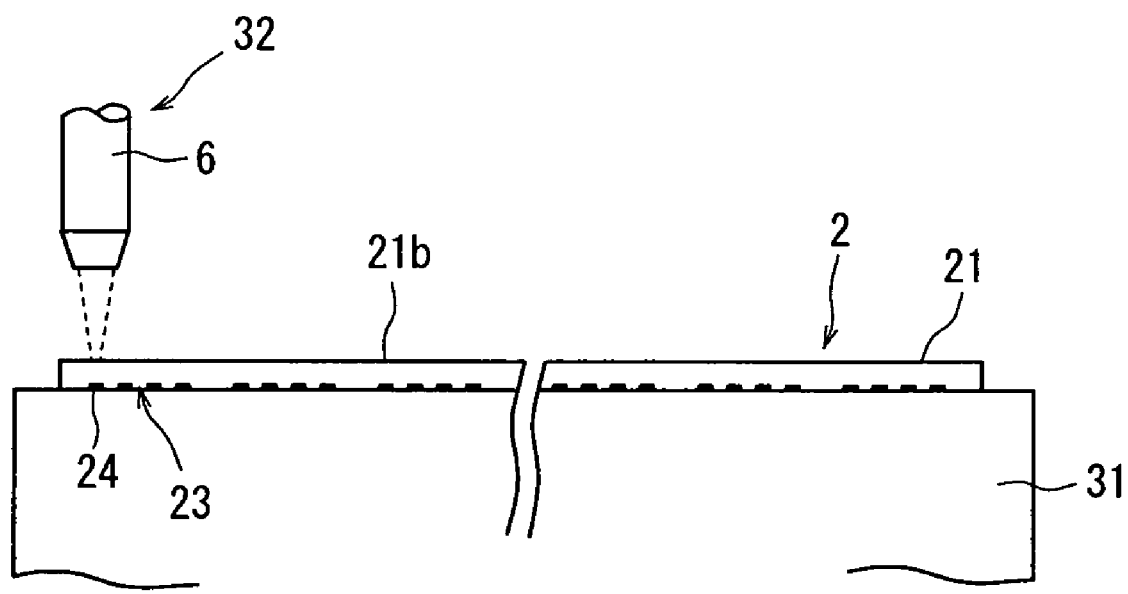
FIG. 5 is a diagram showing a state where the via hole forming area of the semiconductor wafer held on the chuck table of the laser beam processing machine shown in FIG. 2 has been positioned right below a condenser.

After the above alignment work is carried out, the chuck table 31 is moved as shown in FIG. 5 to bring a device 23 at the most left end in FIG. 5 out of the plurality of devices 23 formed in a predetermined direction on the substrate 21 of the semiconductor wafer 2 to a position right below the condenser 6. Then, a bonding pad 24 at the most left end out of the plurality of bonding pads 24 formed on the device 23 at the most left end in FIG. 5 is brought to a position right below the condenser 6.

Figure 6:
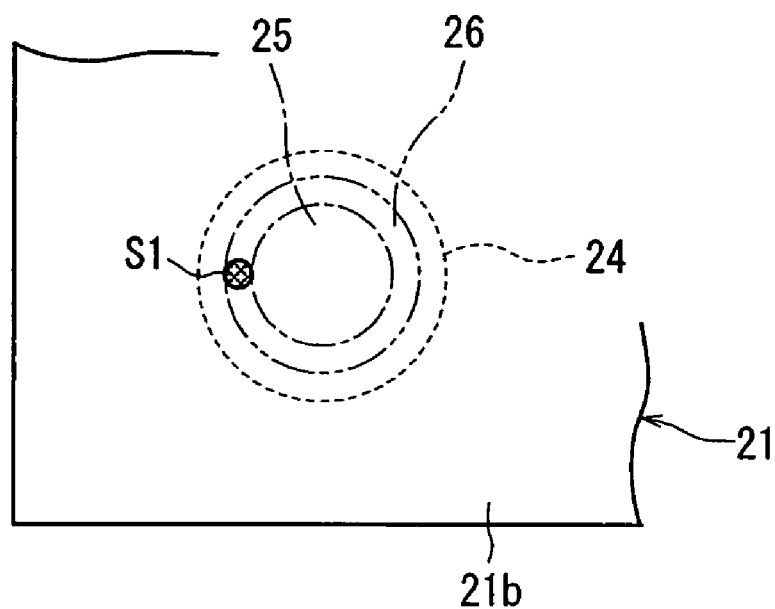
FIG. 6 is an explanatory diagram showing the annular groove forming step in a first embodiment of the via hole forming method of the present invention.

After the predetermined bonding pad 24 is positioned right below the condenser 6 as shown in FIG. 5, next comes the step of forming an annular groove by applying a laser beam to an annular area 26 surrounding a via hole forming area 25 on the rear surface 21b of the substrate 21, as shown in FIG. 6. That is, as shown in FIG. 6, by activating the above acousto-optic deflection means 71 and the second acousto-optic deflection means 72, the spot S1 of a pulse laser beam applied from the condenser 6 of the above laser beam application means 32 is adjusted so as to be positioned in the annular area 26 of the substrate 21. Trepanning processing is then carried out as shown in FIG. 4 to move the spot S1 of the pulse laser beam along the annular area 26.

The processing conditions of the above annular groove forming step are set as follows, for example.

Figure 7:
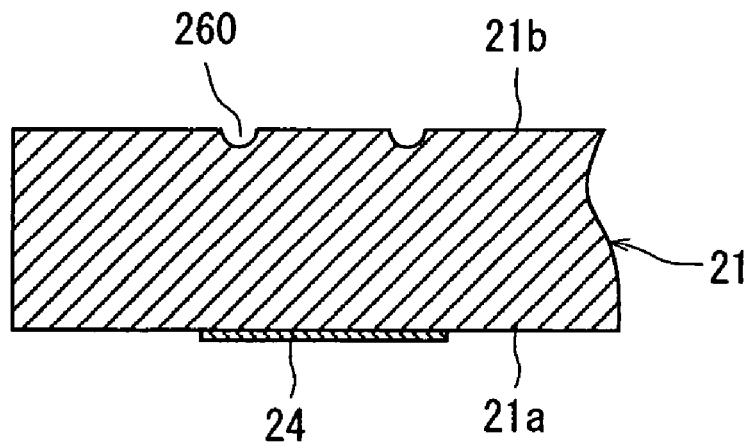
FIG. 7 is a sectional view of the semiconductor wafer which has undergone the annular groove forming step in the first embodiment of the via hole forming method of the present invention.

Light source of laser beam: YVO4 laser or YAG laser
Wavelength: 355 nm
Energy density per pulse: 30 to 40 J/cm$^2$
Spot diameter: 10 μm By carrying out the annular groove forming step under the above processing conditions, an annular groove 260 having a width of 11 to 12 μm is formed in the rear surface 21b of the substrate 21, as shown in FIG. 7. The depth of the annular groove 260 should be about 20 μm. To form this annular groove 260 having a depth of 20 μm, when the diameter of a via hole to be formed (via hole forming area 25) is 100 μm, trepanning shots of 200 pulses of a pulse laser beam are applied along the annular area 26 surrounding the via hole forming area 25.

Figure 8:
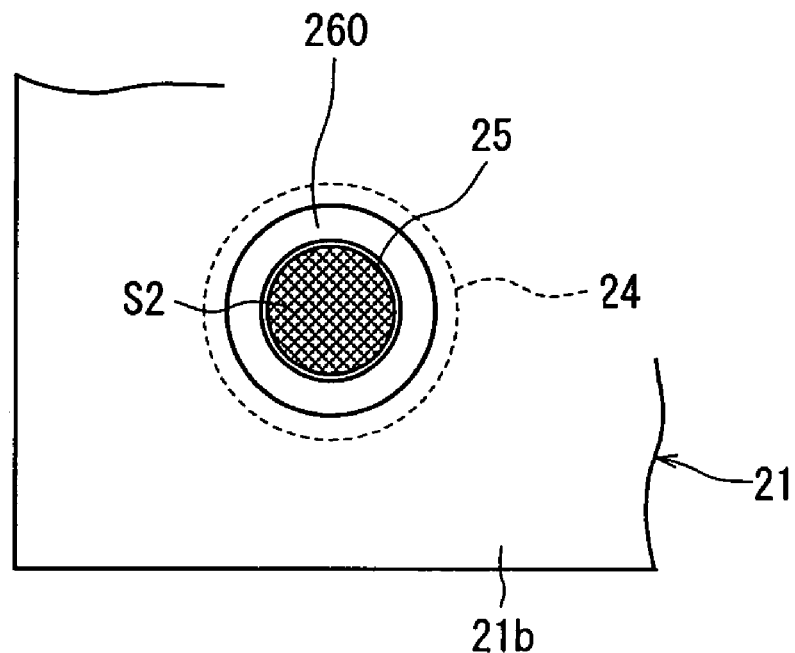
FIG. 8 is an explanatory diagram showing the via hole forming step in the first embodiment of the via hole forming method of the present invention.

The above annular groove forming step is followed by the step of forming a via hole reaching a bonding pad 25 by applying a laser beam to the via hole forming area 25 surrounded by the annular groove 260 from the side of the rear surface 21b of the substrate 21, as shown in FIG. 8. That is, as shown in FIG. 8, the above acousto-optic deflection means 71 and the second acousto-optic deflection means 72 are activated to adjust the spot S2 of a pulse laser beam applied from the condenser 6 of the above laser beam application means 32 so as to be located at the center of the via hole forming area 25 surrounded by the annular groove 260. The diameter of the spot S2 of the pulse laser beam is set to 80 to 90% of the diameter of a via hole to be formed (via hole forming area 25). A predetermined number of pulses of the pulse laser beam are applied from the condenser 6 of the laser beam application means 32, from the side of the rear surface 21b of the substrate 21.

The processing conditions of the above via hole forming step are set as follows, for example.

Figure 9:
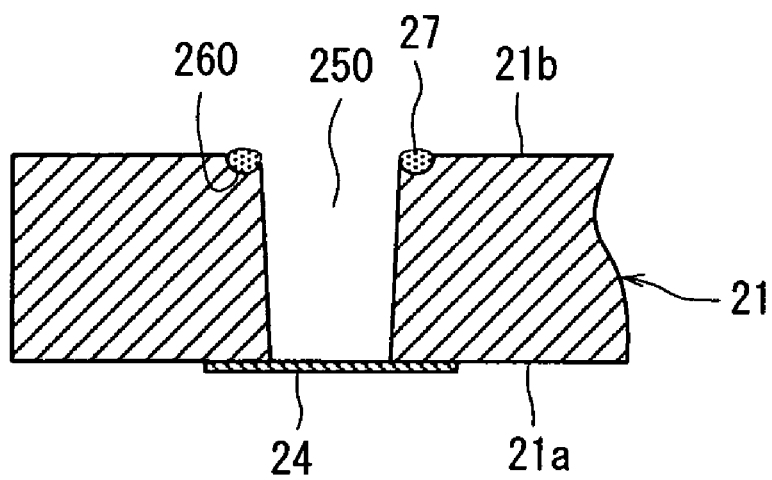
FIG. 9 is a sectional view of the semiconductor wafer which has undergone the via hole forming step in the first embodiment of the via hole forming method of the present invention.

Light source of laser beam: YVO4 laser or YAG laser
Wavelength: 355 nm
Energy density per pulse: 30 to 40 J/cm$^2$
Spot diameter: 90 μm Under the above processing conditions, when the substrate 21 of the semiconductor wafer 2 is made of silicon, a hole having a depth of about 2.5 μm can be formed with one pulse of the pulse laser beam. Therefore, when the thickness of the substrate 21 made of silicon is 100 μm, by applying 40 pulses of the pulse laser beam, a via hole 250 extending from the rear surface 21b to the front surface 21a, that is, a via hole 250 reaching the bonding pad 24 can be formed in the substrate 21, as shown in FIG. 9. Although when the via hole forming step is carried out, debris 27 are produced, as the annular groove 260 is formed around the opening of the via hole 250 by carrying out the above annular groove forming step, the debris 27 accumulate in the annular groove 260. Therefore, the debris 27 do not greatly project from the rear surface 21b of the substrate 21, whereby the accumulated debris do not interfere with the stacking of individually divided chips. Further, when an insulating film made of epoxy resin is formed on the rear surface 21b of the substrate 21, the debris 27 do not break through the insulating film to be exposed.

After the via hole 250 reaching the bonding pad 24 is formed at a position corresponding to the predetermined bonding pad 24 in the substrate 21 of the semiconductor wafer 2 as described above, positions corresponding to the bonding pads 24 are located right below the condenser 6 sequentially to carry out the above annular groove forming step and the via hole forming step.

Next, a description will be subsequently given of a second embodiment of the method of forming a via hole in the semiconductor wafer 2.

In the second embodiment of the via hole forming method, the wafer holding step and the aligning step are carried out in the same manner as in the first embodiment. Then, as shown in FIG. 5, the chuck table 31 is moved to bring a bonding pad 24 at the most left end out of the plurality of bonding pads 24 formed on a device at the most left end in FIG. 5 out of the plurality of devices 23 formed in the predetermined direction on the substrate 21 of the semiconductor wafer 2 to a position right below the condenser 6.

Figure 10:
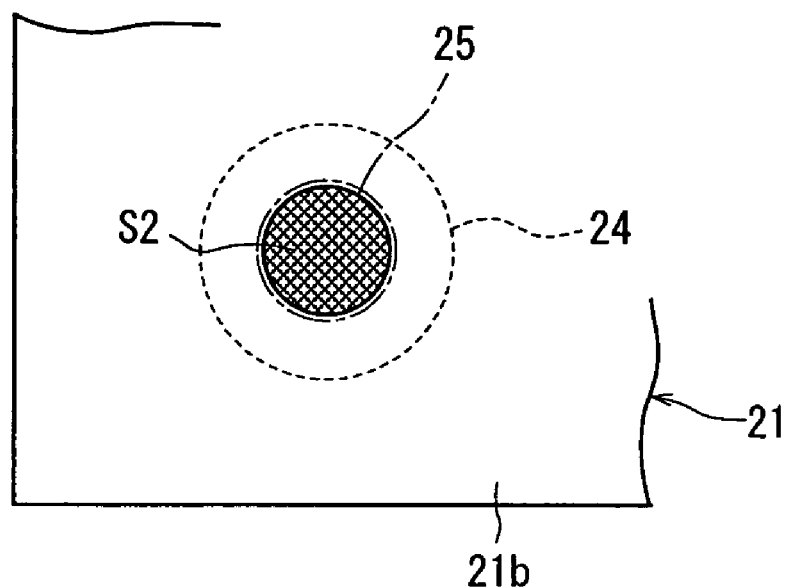
FIG. 10 is an explanatory diagram showing the via hole forming step in a second embodiment of the via hole forming method of the present invention.
Figure 11:
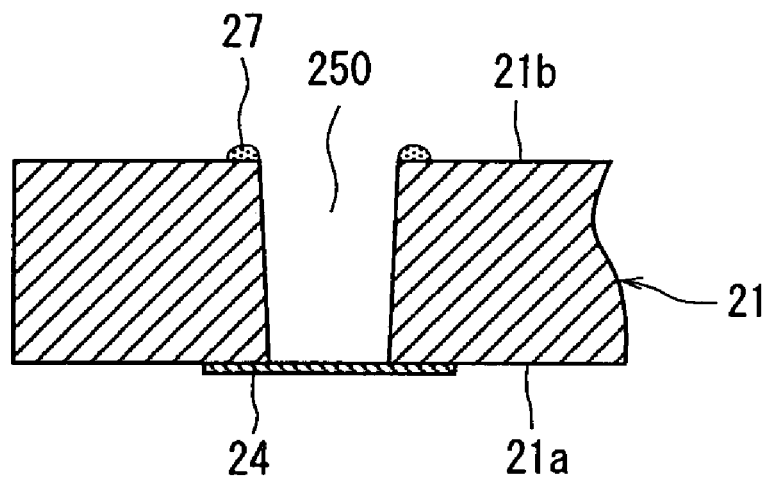
FIG. 11 is a sectional view of the semiconductor wafer which has undergone the via hole forming step in the second embodiment of the via hole forming method of the present invention.

Next comes the step of forming a via hole reaching a bonding pad 24 by applying a laser beam to the via hole forming area 25 on the rear surface 21b of the substrate 21 from the side of the rear surface 21b of the substrate 21, as shown in FIG. 10. That is, as shown in FIG. 10, the above acousto-optic deflection means 71 and the second acousto-optic deflection means 72 are activated to adjust the spot S2 of a pulse laser beam applied from the condenser 6 of the above laser beam application means 32 so as to be located at the center of the via hole forming area 25. The diameter of the spot S2 of the pulse laser beam is set to 80 to 90% of the diameter of a via hole to be formed (via hole forming area 25). A predetermined number of pulses of the pulse laser beam are applied from the condenser 6 of the laser beam application means 32, from the side of the rear surface 21b of the substrate 21. The processing conditions of the via hole forming step may be the same as the processing conditions of the via hole forming step in the above first embodiment. A via hole 250 extending from the rear surface 21b to the front surface 21a, that is, a via hole 250 reaching the bonding pad 24 can be formed in the substrate 21 as shown in FIG. 11 by carrying out this via hole forming step. When this via hole forming step is carried out, debris 27 are produced and accumulate annularly around the opening of the via hole 250.

Figure 12:
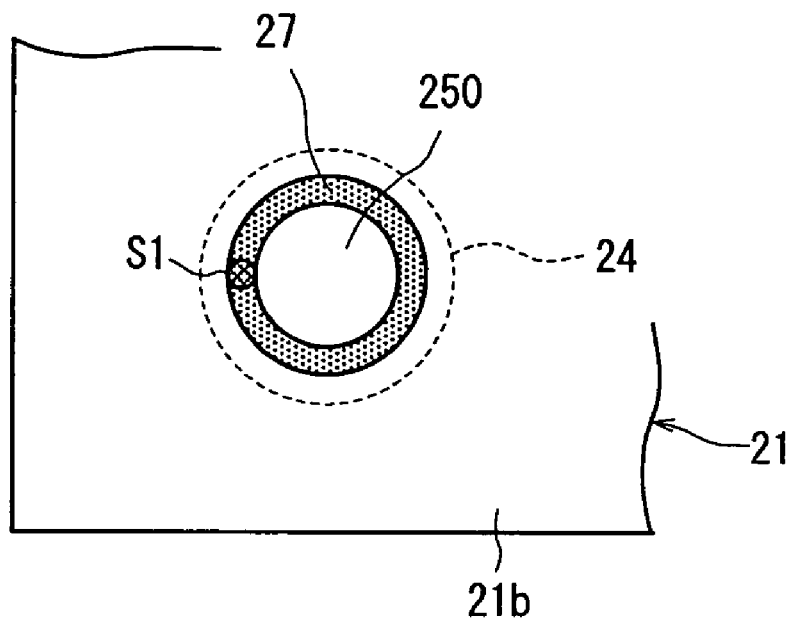
FIG. 12 is an explanatory diagram showing the debris removing step in the second embodiment of the via hole forming method of the present invention.
Figure 13:
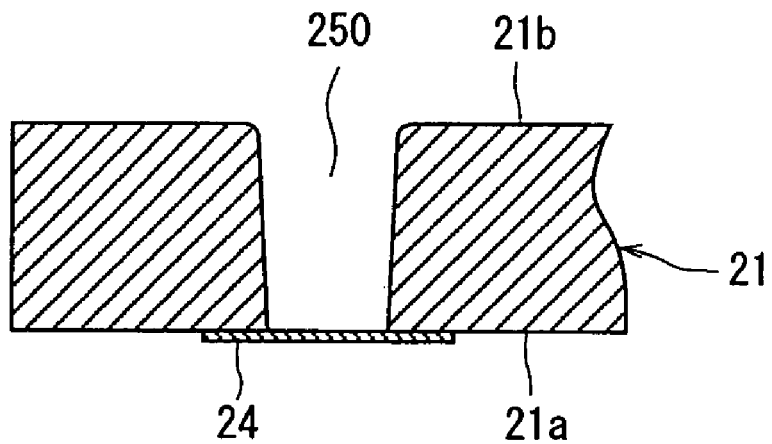
FIG. 13 is a sectional view of the semiconductor wafer which has undergone the debris removing step in the second embodiment of the via hole forming method of the present invention.

Next comes the step of removing the debris 27 by applying a laser beam to the debris 27 which accumulate annularly around the opening of the via hole 250 on the rear surface 21b of the substrate 21 by the above via hole forming step. That is, as shown in FIG. 12, the above acousto-optic deflection means 71 and the second acousto-optic deflection means 72 are activated to adjust the spot S1 of a pulse laser beam applied from the condenser 6 of the above laser beam application means 32 so as to be located at the debris 27 which accumulate annularly around the opening of the via hole 250. Trepanning processing is then carried out as shown in FIG. 4, and the spot S1 of the pulse laser beam is moved along the debris 27 which accumulate annularly. The diameter of the spot S1 of this pulse laser beam is set to 100 to 150% of the width of the debris 27. The processing conditions of the debris removing step may be the same as the processing conditions of the annular groove forming step in the above first embodiment. As shown in FIG. 13, the debris which have been accumulated annularly around the opening of the via hole 250 on the rear surface 21b of the substrate 21 are removed by carrying out this debris removing step. Therefore, the accumulated debris do not interfere with the stacking of individually divided chips. Further, when an insulating film made of epoxy resin is formed on the rear surface 21b of the substrate 21, the debris 27 do not break through the insulating film to be exposed.

What is claimed is:
1. A method of forming a via hole reaching a bonding pad in a wafer having a plurality of devices on a front surface of a substrate and bonding pads on each of the devices by applying a laser beam to a rear surface of the substrate, comprising the steps of:

applying the laser beam to an annular area surrounding a via hole forming area to form an annular groove in the rear surface of the substrate; and then, forming the via hole from the rear surface of the substrate to reach the bonding pad by applying the laser beam to the via hole forming area surrounded by the annular groove while accumulating debris produced during the via hole forming step in the annular groove.

* * * * *